United States Patent [19]
Daly

[11] 4,327,277
[45] Apr. 27, 1982

[54] METHOD FOR LASER SOLDERING

[75] Inventor: Kevin R. Daly, Stow, Mass.

[73] Assignee: Raytheon Company, Lexington, Mass.

[21] Appl. No.: 150,768

[22] Filed: May 19, 1980

Related U.S. Application Data

[63] Continuation of Ser. No. 936,671, Aug. 24, 1978, abandoned.

[51] Int. Cl.³ .................. B23K 26/00; B23K 1/12
[52] U.S. Cl. .................. 219/121 LD; 219/85 BM; 219/121 LT
[58] Field of Search ......... 219/85 BA, 85 BM, 121 L, 219/121 LC, 121 LD, 121 LM, 121 LS, 121 LT

[56] References Cited

U.S. PATENT DOCUMENTS

| | | | |
|---|---|---|---|
| 3,256,524 | 6/1966 | Stauffer | 219/121 LT X |
| 3,294,951 | 12/1966 | Olson | 219/85 BM X |
| 3,453,097 | 7/1969 | Hafner | 219/121 LM |
| 3,463,898 | 8/1969 | Takaoka et al. | 219/121 LT X |
| 3,622,740 | 11/1971 | Ravussin et al. | 219/121 LT X |
| 3,632,955 | 1/1972 | Cruickshank et al. | 219/85 BA |
| 3,893,129 | 7/1975 | Endo et al. | 219/121 L X |
| 3,989,778 | 11/1976 | Osborne | 219/121 LD X |
| 4,020,319 | 4/1977 | Shepard et al. | 219/121 LT X |
| 4,069,080 | 1/1978 | Osborne | 219/121 LD X |
| 4,083,629 | 4/1978 | Kocher et al. | 219/121 LC X |
| 4,131,484 | 12/1978 | Caruso et al. | 219/121 LM X |

FOREIGN PATENT DOCUMENTS

| | | | |
|---|---|---|---|
| 2360308 | 6/1974 | Fed. Rep. of Germany | 219/121 L |
| 2735231 | 2/1979 | Fed. Rep. of Germany | 219/121 LD |
| 392318 | 12/1973 | U.S.S.R. | 219/121 L |

OTHER PUBLICATIONS

Seebe, N. B., "Light Scanners", *IBM Technical Disclosure Bulletin*, vol. 16, No. 6, Nov. 1973, p. 1964.
Charschan et al., "Laser Scribing Apparatus", *Western Electric Technical Digest*, No. 20, Oct. 1970, pp. 19-20.
Eleccion, "Materials Processing With Lasers", *IEEE Spectrum*, Apr. 1972, pp. 62-71.
Lever, R. F., "Applying Radiant Heat to Semiconductor Integrated Circuits", *IBM Technical Disclosure Bulletin*, vol. 20, No. 10, Mar. 1978, pp. 3908-3909.
Martin, B. D., "Individually Flip-Chip Bonding Semiconductor Devices to a Substrate", *IBM Technical Disclosure Bulletin*, vol. 21, No. 5, Oct. 1978, pp. 1854-1855.

*Primary Examiner*—J. V. Truhe
*Assistant Examiner*—Keith E. George
*Attorney, Agent, or Firm*—William R. Clark; Joseph D. Pannone; Milton D. Bartlett

[57] ABSTRACT

A method for simultaneously soldering the two solder covered ends of an electronic chip component to respective conductor pads. Pulsed coherent laser radiation having a predetermined energy profile is separated into two spacially separate beams and they are respectively directed toward the opposing ends of the chip to reflow the solder.

4 Claims, 6 Drawing Figures

METHOD FOR LASER SOLDERING

CROSS-REFERENCE TO RELATED CASES

This is a continuation of application Ser. No. 936,671 filed Aug. 24, 1978 now abandoned.

BACKGROUND OF THE INVENTION

Ceramic chip capacitors are widely used in hybrid and printed circuit modules because they offer ruggedness, volumetric efficiency, wide available range and attractive cost. Generally, the chips are fabricated by interleaving rectangular electrode plates and dielectric layers, alternately attaching the plates to two termination bands on the opposing ends of the chip. A substantial percentage of ceramic chip capacitors are fabricated using barium titanate ceramic as the dielectric material with a typical thickness of 1 mil. Palladium silver is frequently used for the plates and thicknesses in the order of 0.1 mil are typical. It is common practice to use solder joints to connect the termination bands to the circuit of the module.

The primary means of soldering chip capacitors and chip components in general, is with a hand soldering iron which can damage not only the component but also the module. For example, if heat is permitted to conduct into the component, internal pressure may develop from trapped gas molecules within the component that are not able to escape as rapidly as they expand. Also, if the adjoining layers of the component have a mismatch in coefficients of thermal expansion, shear stresses develop within the component. Further, even if the component materials are selected to have similar coefficients of thermal expansion, they likely will exhibit different thermal conductivities such that a temperature gradient will exist between the layers and cause shear stresses of expansion,. Also, stress can be created in the solder joints substantially caused by two conditions. First, during the heating process, the chip is free to expand but the module area is hindered from expansion by the mechanical restraint provided by the cooler surrounding material of the module; compressive stress occurs in the local area of the module but no expansion. Then, upon cooling to room temperature, the chip and solder joints are in a state of tensile stress as the chip is partially restrained from decreasing to its original length by the solidified solder. Second, if the joints are soldered one at a time, substantial stresses occur in the joints and the chip caused by even minimal contact with the chip during the formation of the second solder joint.

The internal component stresses heretofore described can cause component failures and thereby substantially reduce the reliability of a module. Examples of structural defects caused by stress are delaminations, material crumpling, voids, and cracks. The effects may, for example, be short and open circuits or changes in capacitive properties. Also, stress on the soldering joints may result in a poor connection. The prior art includes various techniques for soldering chip capacitors, the most common of which is the use of hand soldering iron. Other methods utilize flame, hot air, or focused radiant energy. However, a need still exists for a means and method for soldering chip capacitors to modules so as to minimize the internal component stresses and the stress on the solder joints.

SUMMARY OF THE INVENTION

Electromagnetic radiation having a wavelength in the range from one millimeter to one nanometer is separated into a plurality of beams which are directed at spaced impingement areas on a support means for supporting materials to be bonded. More specifically, the radiation preferably comprises pulsed coherent laser energy having pulse widths less than 10 milliseconds, a pulse repetition rate less than 10 pulses per second, and a pulse train duration of less than 1 second. It is also preferable that these pulse parameters be selectable so as to be optimized for various applications.

The apparatus so described may be used for soldering. More specifically, it is preferable to use the apparatus for the soldering of chip components onto circuit modules. In this application, it is preferable that the radiation have a wavelength of 1.06 micrometers and pulse widths of 4 to 6 milliseconds. It may also be preferable to support the module on a X–Y table which may be controlled by a microprocessor and which is used to precisely position the module while soldering chip components to it.

DESCRIPTION OF THE DRAWINGS

The invention will be described in more detail by reference to the drawings in which.

DESCRIPTION OF THE PREFERRED EMBODIMENT

Figure 1:
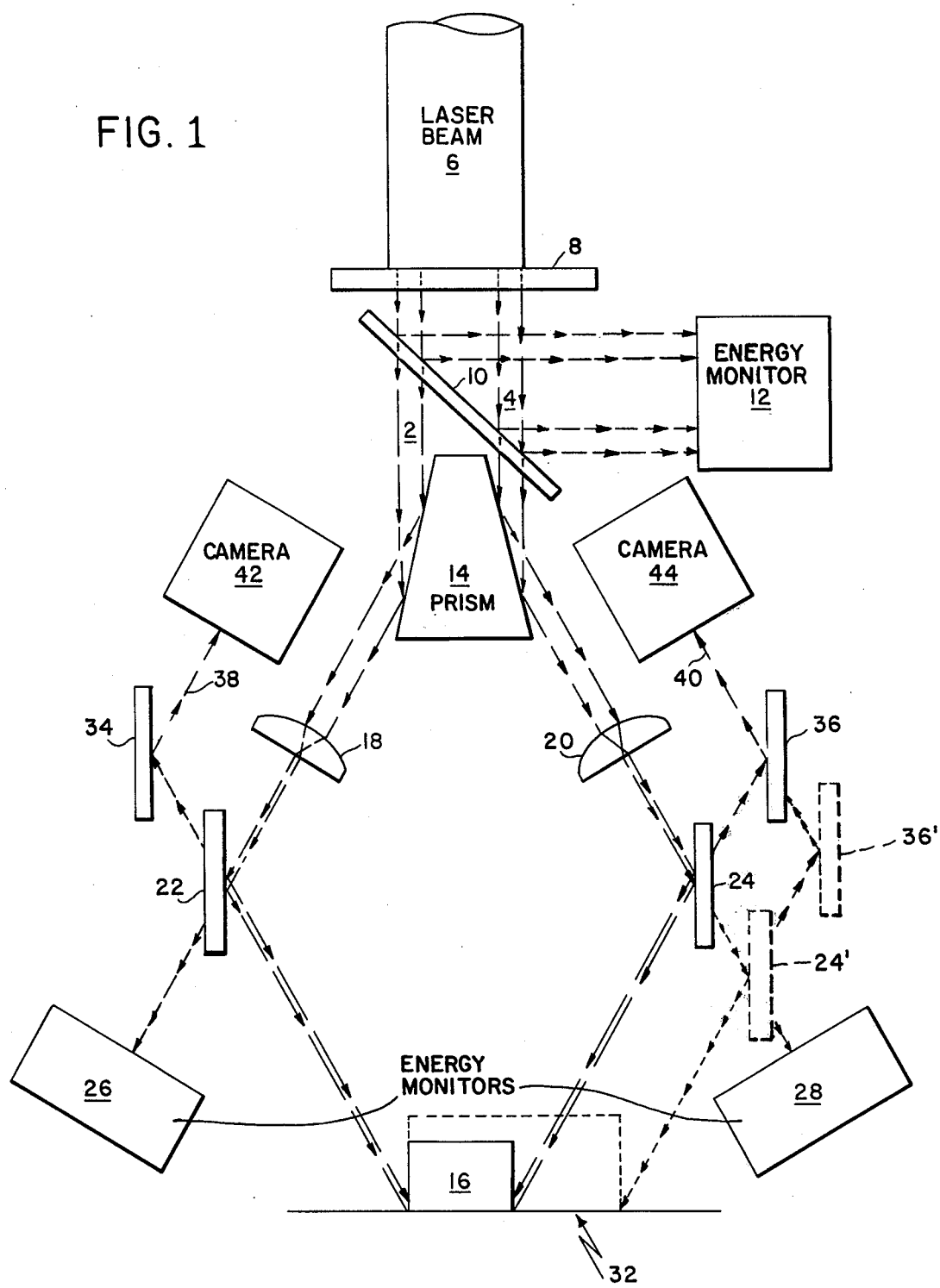
FIG. 1 is a mechanical schematic diagram depicting the operation of the apparatus embodying the invention.

Referring to FIG. 1, an illustration is shown which demonstrates the operation of the apparatus embodying the invention. Two laser beams 2 and 4 are formed by directing a coherent beam 6 of laser radiation at a double slotted aperture disc 8. Preferably, the disc may be selected from a plurality of discs so that the length and width of the slots can be varied for different applications. Any conventional pulse laser such as, for example, laser model SS-380 supplied by Raytheon Company may be used as the source of laser radiation. Preferably, laser radiation with a wavelength of approximately 1.06 micrometers is used for reasons hereinafter described. Also, the preferable pulse widths, pulse repetition rate, and total energy requirements will be described later. The total energy of the two formed beams is monitored by directing the beams through a beam splitting mirror 10, well known in the art, that reflects 1% of the incident energy to a conventional energy monitor 12 as shown in FIG. 1. The remaining 99% of the incident energy of two beams is transmitted through the beam splitting mirror to reflecting prism 14, the function of which is to provide a spacing between the two beams which is sufficiently large so that the beams may be simultaneously directed at two opposing ends of a component 16 as shown in FIG. 1. Next, each beam passes through a conventional cylinder lens 18 and 20 to focus the energy to a size and shape, the preferential specifications of which will hereinafter be described. Each focused beam then impinges on a beam power splitting mirror 22 and 24 which has a characteristic property at the frequency of the energy of reflecting 99% of the beam toward the soldering plane 32 where solder is to be reflowed. The mirrors 22 and 24 transmit the remaining 1% of the energy through to energy monitors 26 and 28. The position of mirror 24 may be adjusted as illustrated by mirror 24' in FIG. 1 so that the beams may be directed to be incident on the soldering plane at different distances apart to facilitate the simultaneous soldering of both ends of different sized components. Additional adjustment is further attained through step changes in the position of mirror 22 in a like manner to the adjustment of mirror 24. Also, as shown in FIG. 1, 100% reflecting mirrors 34 and 36 direct the images of visible light 38 and 40 from the soldering plane to television cameras 42 and 44 for aligning the position of a component 16 relative to the sight lines where the two laser beams are directed when activated. The position of mirror 36' is used in conjunction with the position of mirror 24'. Visible light may be transmitted to the soldering area by the use of fiber optics (not shown). The hardware heretofore described is well-known to one skilled in the art.

Figure 2:
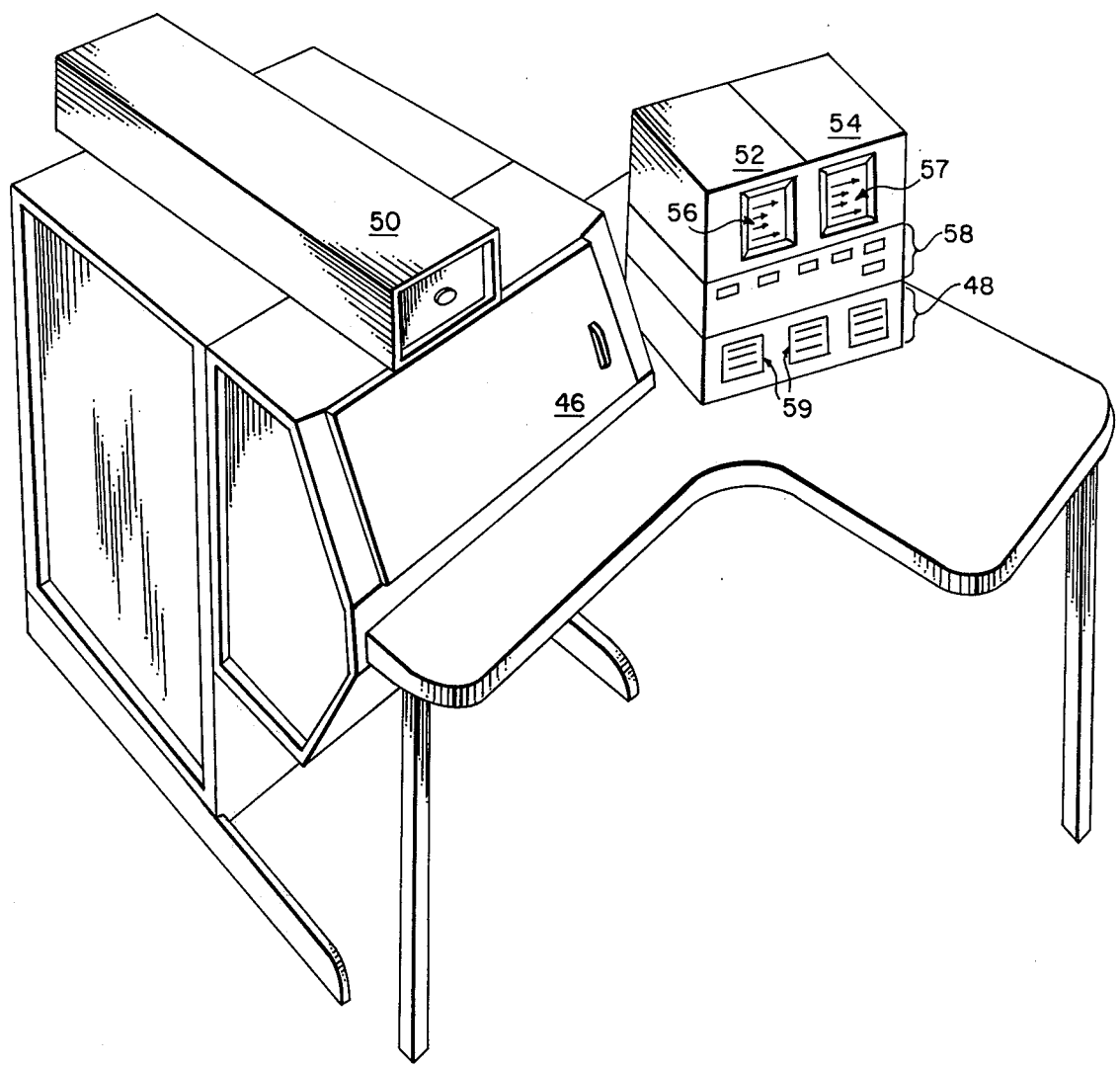
FIG. 2 is a pictoral view of the outward appearance of a laser soldering apparatus.
Figure 3:
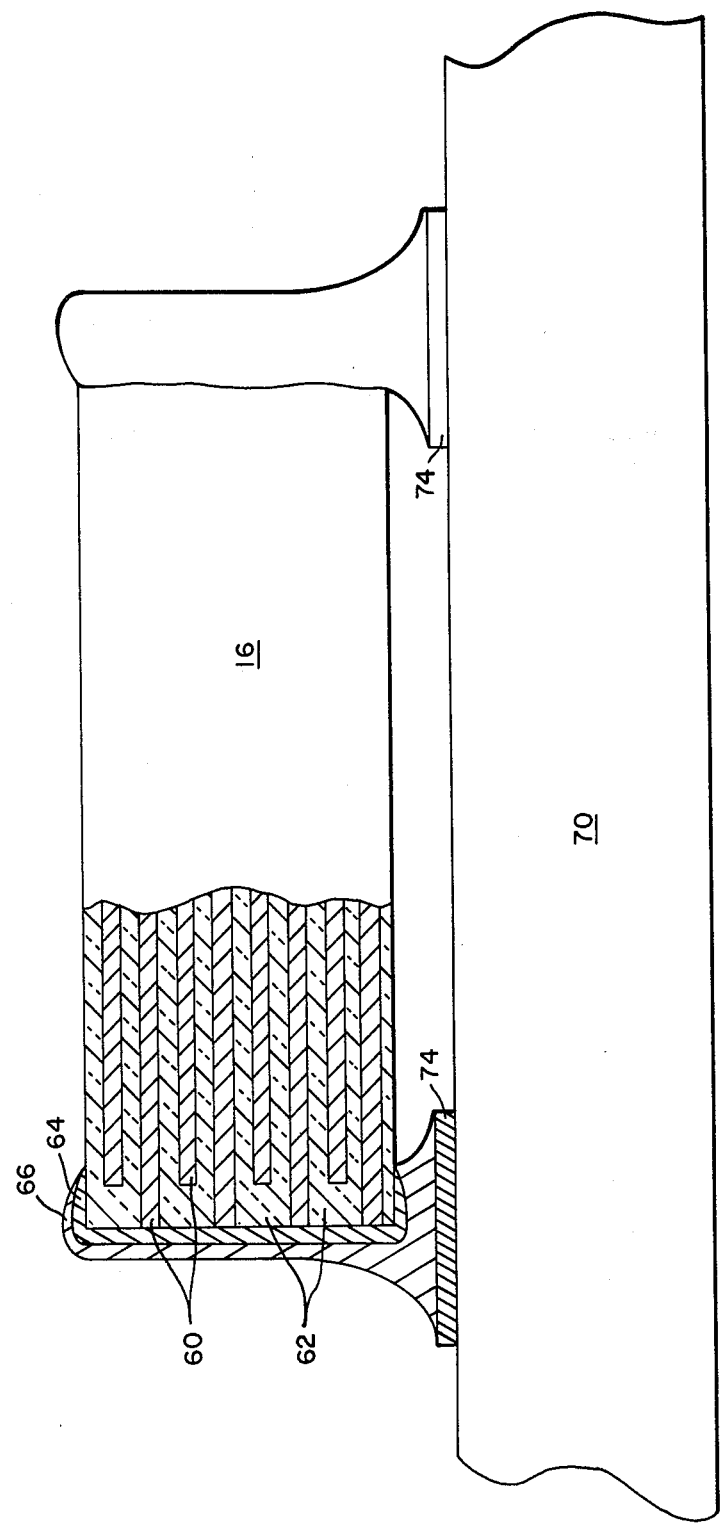
FIG. 3 is an elevation view with partial section showing a chip capacitor soldered to a module circuit.

In operation, referring to FIG. 2, a protective shroud 46 is opened by the operator to expose a conventional X-Y table (not shown). Typically, a printed circuit module 70, as shown in FIG. 3, is rigidly affixed to the X-Y table by any means and a chip component 16 is placed across the conductor pads 74 which are part of the printed circuit module and to which the chip component is to be soldered. After the protective shroud is closed, the X-Y table control panel 48 which has both coarse and fine adjustments for both axes is used to position the module so that when the laser 50 is activated, the two beams as described with reference to FIG. 1 will simultaneously impinge at the bases of the opposing ends of the chip component. The proper positioning of the X-Y table may be accomplished with the television monitors 52 and 54 connected to the television cameras in FIG. 1 and which have transparent overlays 56 and 57 to indicate the area and location of laser radiation when activated. After the laser firing parameters, which are discussed hereinafter, are selected using the laser control panel 58, the laser is activated. The laser radiation energy absorbed by the solder on the pad and the solder on the chip component is converted to thermal energy which reflows the solder. When the energy is removed and the solder cools, a solder joint is formed at each end of the chip component connecting it to the circuit of the module. The energy in joules at the total energy monitor and the individual beam monitors is displayed on the laser control panel.

In an alternate embodiment, a microprocessor (not shown) is used to control the position of the X-Y table and the excitation of the laser such that a plurality of chip components can be sequentially soldered to a single module without operator intervention. Whether in automatic or manual mode, the X and Y coordinates of the X-Y table are displayed on digital readouts 59 on the X-Y control panel.

The soldering apparatus heretofore described provides for a soldering technique that has substantial improvements over the prior art. The improvements substantially result from the simultaneous reflow of solder at both ends of the chip and the operator of the apparatus having very precise control over the soldering parameters.

With reference to the background and FIG. 3, chip capacitors are fabricated by interleaving rectangular electrode plates 60 and dielectric layers 62 alternately attaching the plates to two termination bands 64 at opposing ends of the chip. For example, the electrode plates may be fabricated of palladium silver while the dielectric is a ceramic material. A chip may be dipped into solder 66 during fabrication. It has been found that when two strips of materials having different coefficients of thermal expansion are bonded along an interface and heated isothermally, the composite will bow concave to the material having the lower coefficient of expansion. A neutral region is established within each material which comprises a locus of unstressed points which define a boundary between compressive and tensile stresses; the maximum compressive and tensile stresses generally exist on the surfaces of the materials. In the case of a chip capacitor where the bending moments are counterpoised by successive layers of ceramic and electrode plates such that the interfaces are maintained planar, the stresses are at a minimum at the center of each layer and maximum at the boundaries. Also, in the case of a chip capacitor, even though the adjacent layer may have a similar coefficient of thermal expansion, the materials typically have different thermal diffusivities such that stresses result from different expansions caused by different temperatures rather than different coefficients of expansion. Thermal diffusivity of a material is defined as its thermal conductivity divided by the product of its specific heat and density. Accordingly, to prevent damage to a chip capacitor or a chip component, it is, in general, important to minimize the heat permitted to transfer into the chip during the soldering process.

The laser solder apparatus heretofore described provides very precise control over the amount and profile of energy transferred to the solder and thereby provides a means of minimizing the heat transferred to the chip. For example, the basic equation for the energy required to melt a substance is given by the equation $$E_M/V = \delta(C\Delta T + H_s)$$

where $E_M$ is the required melting energy in joules, V is the volume to be melted in cubic centimeters, $\delta$ is the material density in grams per cubic centimeter, C is the material specific heat in calories per gram per degree centigrade, $\Delta T$ is the melting temperature minus the initial material temperature in degrees centigrade, and $H_s$ is the heat of fusion in calories per gram. Generally, solder should be approximately 30° to 50° above its melting point to achieve good wetting. Therefore, the total energy required to reflow is approximately given by the equation $$E_r/V = \delta(C\Delta T_1 + H_s) + \delta(C\Delta T_2)$$

where $\Delta T_2$ is the desired reflow temperature minus the melting temperature Assuming an "A" size (0.035×0.055×0.65 inches) chip capacitor including an end termination of 0.2 mils of silver and 1.5 mils of copper followed by a 1.5 mil 63 Sn/37 Pb solder dip, and all three materials reaching the temperature of 215° C. or 32° C. above the 63/37 solder eutectic temperature, a total energy of 0.434 joules is required to reflow each solder joint. Further, assuming a reflection factor at the solder of 50% and a 90% optics transmission factor, approximately 0.964 joules would preferably be delivered in each beam for the specified conditions. Similarly, for example, 3.7 joules would preferably be delivered in each beam to solder an "A" size (0.235×0.075×0.210 inches) chip capacitor. A series of tests were made with the apparatus and energy monitor data was taken for various combinations of double slotted discs and laser parameters. The precise amount of energy as theoretically calculated above with any deviations arising from practical considerations can be delivered by the apparatus with a high degree of repeatability and consistency.

The laser model SS-380 is a Noedymium Yttrium Aluminum Garnet (Nd-YAG) type that operates at a wavelength of 1.06 micrometers. The pulse width is variable from two to ten milliseconds with the pulse repetition rate selectable to 6, 4, 2 and 1 pulse per second and manual single shot. There is a maximum power of 40 watts. In the preferred embodiment, the SS-380 laser system was modified to provide even greater flexibility. Pulse widths to 30 milliseconds in 0.1 millisecond increments are available. Also, 30 joules per pulse protected at 50 watts may be delivered. Further, a burst mode is provided which operates above 10 pulses per second.

The use of 1.06 micrometer wavelength minimizes light reflection from solder as compared to a 10.6 micrometer Carbon Dioxide laser. With the increased energy absorption by the solder, a smaller percentage reflects toward the chip to result in increased stress within the chip. Also, because the energy is coherent, the cylindrical lens can be designed to precisely focus substantially all the energy so that the incidence of energy directly onto the chip is substantially eliminated. Furthermore, the preferred laser energy profile comprises a train of pulses with relatively narrow pulse widths. For example, to solder an "A" size chip capacitor, it has been determined to be preferable to deliver six pulses at a pulse repetition rate of six pulses per second, each pulse having a pulse width of four to six milliseconds. The double slotted aperture disc used is one which provides a beam having a depth dimension approximately equal to the depth (0.035 inches) dimension as viewed on FIG. 3. Also, the laser amplitude is set at 20% of maximum. It is preferable not to vary the amplitude when changing from one component size to another; rather, the double slotted aperture is changed and the pulse repetition rate, pulse width, and duration are varied to optimize for the particular application.

The narrow pulse train energy profile described in the previous paragraph provides significant protection against component damage during and immediately after the soldering process. First, the emissivity of liquid solder is substantially greater than in the solid state. Accordingly, a relatively large percentage of heat added to the solder after it becomes liquid is conducted to the component. It follows that if the energy that is added to the solder is precisely controlled in small increments so that the solder passes into the liquid state for only a very brief period of time such as milliseconds, the amount of heat conducted to the component is minimized. Second, for any given point within a chip capacitor, the stress is maximized when the difference in temperature between the electrodes and dielectric layers is also maximum. Further, studies have shown that a maximum difference occurs at approximately three time constants where one time constant is defined as the time for a point to rise to 63% of its total temperature rise caused by the addition of heat to the material. This is logical because if the temperature is raised very gradually over a relatively long period of time, the different diffusivities of the layers have very little effect and the difference in temperature between the two layers is very small. Provided their coefficients of thermal expansion are well matched, the stress, up to a limit, will become smaller as the number of time constants is increased. Also, if the number of time constants is reduced from three time constants, the material has insufficient time to react. In most industrial applications the production rate is important such that it is not feasible to expend considerable time to raise the temperature of components slowly. Therefore, in order to minimize stress, it is important to transfer heat to the solder very rapidly. The four to six millisecond pulses provide an introduction of heat into the solder in a time substantially less than one time constant.

The simultaneous soldering of both ends of a chip capacitor by the use of two beams of laser radiation provides substantial improvements in stress relief over prior art methods. More specifically, after cooling down there is less stress in the solder joints and accordingly less stress applied to the chip. The simultaneous reflow at both ends of the component without external contact permits the component to float on the liquid solder. This provides a sufficient thickness of solder between the component and the printed circuit board. More specifically, it is preferable that not less than 0.0025 inches of solder solidify under the chip to limit stress in the chip and plastic fatigue in the solder.

Figure 4A:
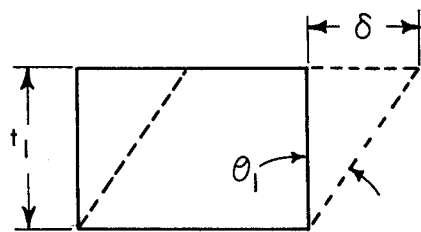
FIGS. 4A and 4B are diagrams demonstrating the relationship of the creep angle for two different solder thicknesses $t_1$ and $t_2$, for a given creep distance $\delta$.
Figure 4B:
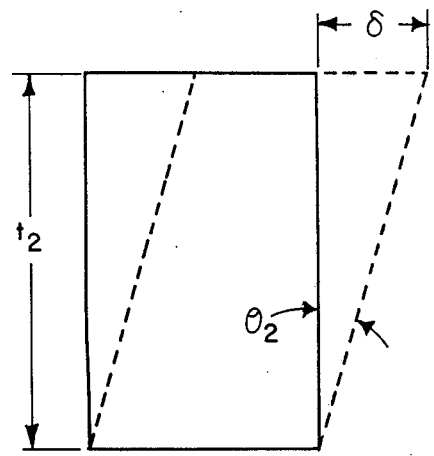
Figure 5:
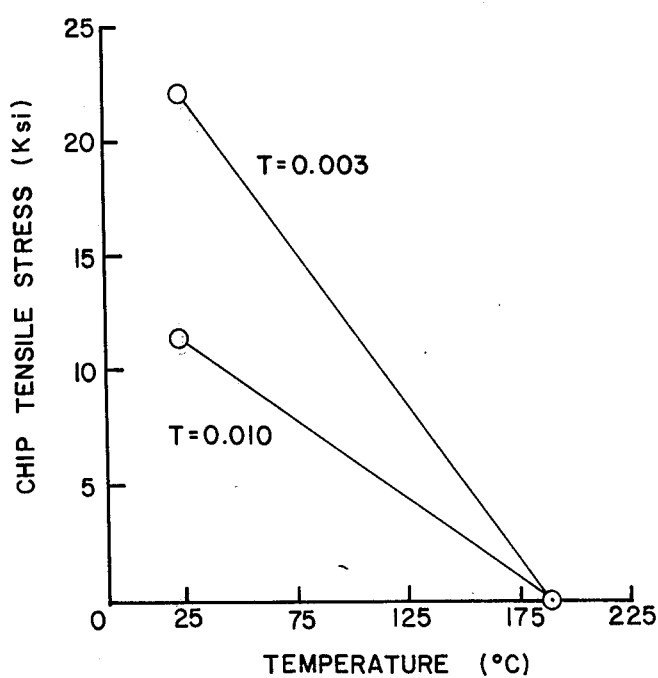
FIG. 5 shows a graph of chip tensile stress plotted as a function of temperature for two different solder thicknesses.

Referring to FIGS. 4A and 4B, it is illustrated that given $\delta$, the creep distance at each end of the component required to compensate for the component expansion during soldering being greater than the printed circuit module, the creep angle $\theta$ gets smaller as the thickness of the solder is increased. More specifically, $\theta_2$ is smaller than $\theta_1$ because $t_2$ is greater than $t_1$. FIG. 5 plots emperical data that demonstrates that the tensile stress applied to the component after cooling down is reduced when the thickness is increased from 0.003 inches to 0.010 inches. Also, the simultaneous reflow substantially eliminates the vertical stress applied to the chip when soldering one end after the other end has already been soldered.

Although the invention has been described with a preferred embodiment, it will be appreciated to those skilled in the art that various modifications can be made without departing from its scope. For example, although the discussion is primarily directed at chip components and chip capacitor in particular, the general soldering technique would be applicable to a variety of applications. It is therefore intended that the invention not be limited except as defined by the claims.

What is claimed is:

1. A method of soldering an electronic chip component having solder on opposing ends to two supporting conductor pads connected to a substrate, comprising the steps of:
   providing pulsed coherent laser radiation having pulse widths of less than 10 milliseconds with a repetition rate of less than 10 pulses per second, the pulse train duration of said radiation being less than one second;
   separating said radiation into two simultaneous spatially separate beams having substantially equal energy;

directing said beams inward toward said opposing ends of said electronic chip component to reflow said solder; and removing said beams to substantially simultaneously form solder joints between said component and said pads.

2. The method recited in claim 1 wherein said pulse widths are in the range from 4 to 6 milliseconds.

3. The method recited in claim 2 wherein said pulse train comprises 6 pulses.

4. The method recited in claim 1 wherein the wavelength of said radiation is 1.06 micrometers.

* * * * *

UNITED STATES PATENT OFFICE
CERTIFICATE OF CORRECTION

Patent No. 4,327,277           Dated April 27, 1982

Inventor(s) Kevin R. Daly

It is certified that error appears in the above-identified patent and that said Letters Patent are hereby corrected as shown below:

Insert after the "Abstract": --The Government has rights in this invention pursuant to Contract No. N00030-75-C-0062 awarded by the Department of the Navy--;

Column 5, Line 5:  Change "A" to --F--;

Column 5, Line 14: Change "Noedymium" to --Neodymium--.

Signed and Sealed this

Nineteenth Day of October 1982

[SEAL]

Attest:

GERALD J. MOSSINGHOFF

Attesting Officer

Commissioner of Patents and Trademarks